United States Patent [19]

Ogawa

[11] Patent Number: 4,858,975
[45] Date of Patent: Aug. 22, 1989

[54] VACUUM CHUCK APPARATUS FOR WET PROCESSING WAFERS

[75] Inventor: Tsutomu Ogawa, Machida, Japan

[73] Assignee: Fujitsu Limited, Kawasaki, Japan

[21] Appl. No.: 258,512

[22] Filed: Oct. 17, 1988

[30] Foreign Application Priority Data

Oct. 22, 1987 [JP] Japan .................................. 62-267119

[51] Int. Cl.⁴ .............................................. A47B 97/00
[52] U.S. Cl. ...................................... 294/64.1; 55/158;
901/40; 414/437
[58] Field of Search ...................... 55/158; 294/64.1;
901/40; 414/737, 744.8

[56] References Cited

U.S. PATENT DOCUMENTS 2,812,061  11/1957  Pfister ................................. 294/64.1

Primary Examiner—Bernard Nozick
Attorney, Agent, or Firm—Staas & Halsey

[57] ABSTRACT

A vacuum chuck apparatus operable in both gas and liquid includes a liquid-gas separating membrane which allows passage of gas molecules but prevents passage of liquid. The liquid-gas separating membrane is disposed between an inlet hole of the chuck and a manifold which is connected to a pneumatic system. The pneumatic system includes an aspirator, a compressor and a switching valve. The vacuum chuck is immersed into a liquid, compressed gas purges the liquid in the inlet hole, then the switching valve is switched to the aspirator. An object, such as a semiconductor wafer, is vacuumed quickly to the chuck, and the inlet hole is closed by the object. If a small quantity of liquid intrudes into the chuck, it is stopped by the liquid-gas separating membrane.

13 Claims, 6 Drawing Sheets

VACUUM CHUCK APPARATUS FOR WET PROCESSING WAFERS

BACKGROUND OF THE INVENTION

1. Field of the Invention

The present invention relates generally to vacuum chucks, and more specifically, to a vacuum chuck apparatus which is applicable for wet processing in semiconductor manufacturing.

2. Description of the Related Art

In semiconductor manufacturing processes, there are many occasions when semiconductor substrates or wafers must be handled to load, reload or unload them to or from a carrier or holder. In such cases, tweezers or forceps are widely used for handling. However, in order to avoid flaws or other damage caused by tweezers, vacuum chucks or Bernoulli flow chucks are increasingly being used.

Semiconductor processing includes many treatments which use water or chemicals. Such a process is called a wet process, as opposed to a dry process in which the wafer is treated in air or gaseous ambient. Many of these wet processes are carried out by using batch processing to increase their output. Several wafers are loaded in a holder, and immersed into chemicals to process them. In such batch processing systems, especially in wet processing, stains are sometimes left where the wafer contacts the holder, thus spoiling the uniformity of processing. Therefore, a problem of how to prevent such stain persists in the wet processing art.

From the view point of uniformity of products, however, a one by one processing system is better than a batch system. This is because each of the wafers can be checked, and the holding or contact points of the wafer can be shifted to prevent staining. Sometimes the wafer is held by its back surface to protect the front surface from effects caused by contact with a tool. In such cases, the wafer chuck becomes very important. For a dry process, vacuum chucks or the Bernoulli flow chucks can be used, but heretofore there have been no vacuum chucks which could be used in a wet process.

SUMMARY OF THE INVENTION

An object of the present invention, therefore, is to provide a vacuum chuck which can be used in wet processing.

Another object of the present invention is to simplify wafer handling in wet processing and thereby decrease the number of defects caused by wafer handling.

The vacuum chuck according to the present invention is provided with a liquid-gas separating membrane, which separates liquid from gas. The liquid-gas membrane is made of a material which has a plurality of tiny holes which allow gas to pass through, but not liquid. The membrane is installed between the inlet and manifold of the vacuum chuck. This makes the chuck operate in a manner similar to an ordinary air vacuum chuck.

The chucking system of the present invention comprises an aspirator for exhausting gas in the chuck, a compressor for sending compressed air into the chuck, and a switching valve for switching the connection of the manifold to the compressor or to the aspirator.

When the chuck is immersed into a liquid, the liquid is stopped by the liquid-gas separating membrane and does not go further into the manifold. The opening of the inlet of the chuck faces the wafer in the liquid. The liquid in the chuck is forced out of the chuck by the compressed air, and the switching valve is switched from the compressor to the aspirator. Then, the substrate is vacuumed to the chuck and held thereto in a manner similar to an ordinary air vacuum chuck. Even if a small part of the liquid intrudes into the manifold at this instant, it is stopped by the liquid-gas separating membrane. Thus, the attracting strength of the chuck is not lost.

When the chuck of the present invention is used in air, it operates similarly to an ordinary vacuum chuck. This chuck is easily and conveniently applied to various kinds of wet processing, such as washing, etching, and rinsing, etc. By holding the substrate from its back side by the vacuum chuck of the present invention, the front side of the substrate can be treated with various wet processes without leaving stains or damage on the front surface.

These objects, together with other objects and advantages which will be subsequently apparent reside in the details of construction and operation of the apparatus as more fully hereinafter described and claimed, reference being had to the accompanying drawings forming a part hereof, wherein like reference numerals refer to like parts throughout.

BRIEF DESCRIPTION OF THE DRAWINGS

FIGS. 1(a) and 1(b) are partial cut away views of a vacuum chuck according to the present invention, schematically illustrating its operation in liquid, wherein:

FIG. 1(a) shows a state when the chuck is immersed into a liquid, but the liquid is stopped by a liquid-gas separating membrane; and FIG. 1(b) shows a state when the chuck is evacuated and a wafer is vacuumed onto the chuck;

FIGS. 3(a) through 3(c) are schematic views of various stages of operation of the vacuum chuck of the present invention, wherein:

FIG. 3(a) shows a state when the chuck is immersed into a liquid;

FIG. 3(b) shows a state when the liquid in the chuck is exhausted by compressed air; and FIG. 3(c) shows a state when the chuck is evacuated by an aspirator, and a wafer is vacuumed onto the opening of the chuck;

FIGS. 5(a) and 5(b) shows a second preferred embodiment of a vacuum chuck according to the present invention which holds the wafer vertically, wherein:

FIG. 5(a) is a schematic front view; and

FIG. 5(b) is its cross-sectional view;

FIGS. 8(a) and 8(b) shows schematically a typical wafer holder widely used in various semiconductor processes, wherein:

FIG. 8(a) is a cross-sectional view; and

FIG. 8(b) is a top plan view;

DETAILED DESCRIPTION OF THE PREFERRED EMBODIMENTS

The following description of the invention will refer to the treatment or handling of semiconductor wafers, but it will be apparent that the invention is applicable to the treatment or handling of similar objects. Further, the shape of the object is not necessarily flat; it could be cube or spherically-shaped.

Figure 1:
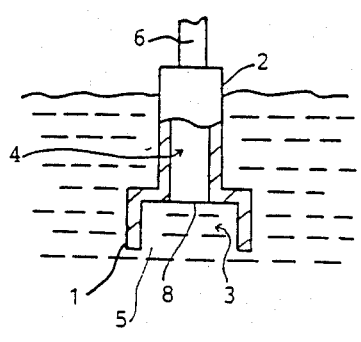
Figure 1:
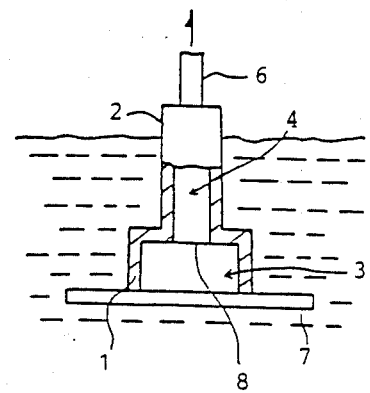

FIG. 1 shows a schematic, partial cut-away view of a vacuum chuck according to the present invention. The appearance of the chuck is similar to those of ordinary vacuum chucks. The chuck includes a head 1 disposed at one end of a holder 2. A cavity 3 is formed in the head 1, and is in communication with a manifold 4 extending axially through the holder 2. The manifold 4 and the cavity 3 are connected to each other, and a bottom of the cavity 3 is opened forming an inlet 5. The opposite end of the manifold 4 is connected to hydraulic conduit 6 which is connected to an aspirator (not shown). When the chuck is evacuated by the aspirator, it attracts a wafer 7 which becomes positioned over the inlet 5 and is held there by vacuum. Thus, the wafer 7 closes the inlet 5.

A significant distinction of the vacuum chuck of the present invention over an ordinary one is a liquid-gas separating membrane 8 attached between the inlet 5 and the manifold 4. In the embodiment of FIG. 1, the liquid-gas separating membrane 8 spans over a junction plane of the manifold 4 and the cavity 3. The liquid-gas separating membrane 8 is a hydrophobic, gas permeable membrane having a plurality of tiny holes which allow gas to pass therethrough, but not liquid. Thus, as shown in FIG. 1(a), when the vacuum chuck is immersed into a liquid, the liquid is dammed at the liquid-gas separating membrane 8, and does not go further into the manifold 4. When the vacuum chuck is evacuated (the process will be described later), the chuck attracts the wafer 7 as shown in FIG. 1(b). Such operation is similar to that of ordinary vacuum chucks operated in air ambient.

Figure 2:
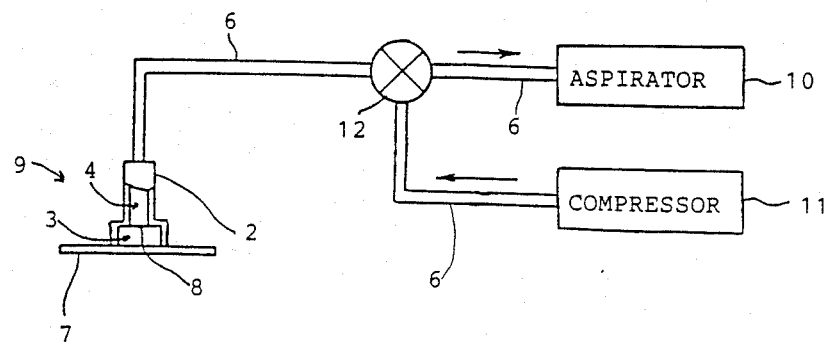
FIG. 2 is a schematic view of a vacuum chuck system according to the present invention.

A fundamental composition of a vacuum chucking system by the present invention is shown in FIG. 2. The system includes a vacuum chuck 9, an aspirator 10, a compressor 11 and a switching valve 12. Elements 10, 11 and 12 are individually conventional. The compressor 11 may be replaced by any suitable means for supplying compressed gas. Hydraulic conduit 6 connects the switching valve 12, the chuck 9, the aspirator 10 and the compressor 11. When the switching valve 12 is switched to the compressor 11, the compressed air exhausts the liquid from the chuck 9. When the switching valve 12 is switched to the aspirator, the chuck 9 vacuums the wafer 7 onto the inlet 5 and holds it in a manner similar to that of ordinary vacuum chuck.

FIGS. 3(a) through 3(c) illustrate a procedure for operating the vacuum chuck of the present invention. In this embodiment, a wafer 7 is immersed in a liquid 13, and positioned on a support 14. First, the chuck 9 is immersed into the liquid and juxtaposed over the wafer 7 as shown in FIG. 3(a). In this stage, the liquid 13 may intrude into the cavity 3 but it cannot go further into the manifold 4 because the liquid is dammed by the liquid-gas separating membrane 8. Usually, the liquid is stopped before it reaches the liquid-gas separating membrane 8, because there is gas remaining in the cavity 3. Thus, the surface of the liquid in the cavity 3 is usually lower than the liquid-gas separating membrane 8. The liquid level in the cavity 3 shown in FIG. 3(a) is at the highest possible level.

Next, the switching valve 12 is switched to the compressor so that, as shown in FIG. 3(b), the liquid is exhausted out from the cavity 3, and bubbles 15 come out from the inlet 5. The pressure of the gas 11 (nitrogen for example) compressed by the compressor is not necessarily very high. The ambient pressure plus a hydrostatic pressure at the bottom of the liquid chamber is sufficient. Too high a gas pressure may cause damage to the liquid-gas separating membrane 8. When the head is brought close to the wafer 7 keeping the inlet 5 parallel to the surface of the wafer, the liquid over the wafer beneath the head 1 is also purged.

After the gas in the cavity 3 is removed, the switching valve 12 (not shown) is switched to the aspirator to exhaust the gas in the chuck. Then, as shown in FIG. 3(c), the wafer 7 is vacuumed toward the chuck until the inlet 5 becomes closed by the wafer 7. In this instance, some of the liquid may intrude into the cavity 3. However, the inlet 5 is closed very quickly by the wafer 7, and the amount of intruded liquid is insignificantly small compared to the volume of the cavity 3. Thus, operation of the chuck is not hampered.

It should be noted that if the chuck is held loosely, the chuck is attracted to the wafer as shown in FIG. 3(c), rather than the wafer 7 being lifted up toward the chuck. Such soft holding of the chuck is more desirable than holding it rigidly, because if the wafer size is large, the resistance of the liquid against the vertical motion to the surface of the wafer becomes large. This could result in a breakage of when it is lifted up suddenly. After the inlet 5 of the chuck is closed tightly by the wafer, the chuck may be moved carefully. Even if the wafer is broken accidentally, the liquid will not penetrate through the liquid-gas separating membrane 8, and the system is never harmed.

Figure 4:
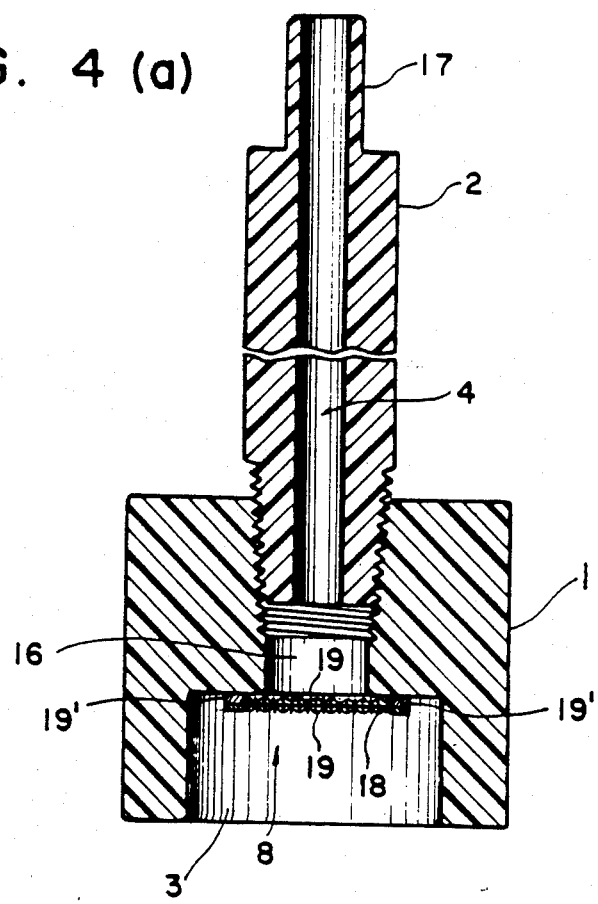
FIG. 4(a) is a cross-sectional view of a preferred embodiment oil the vacuum chuck.
FIG. 4(b) is an end view of the vacuum chuck of FIG. 4(a)
Figure 4:
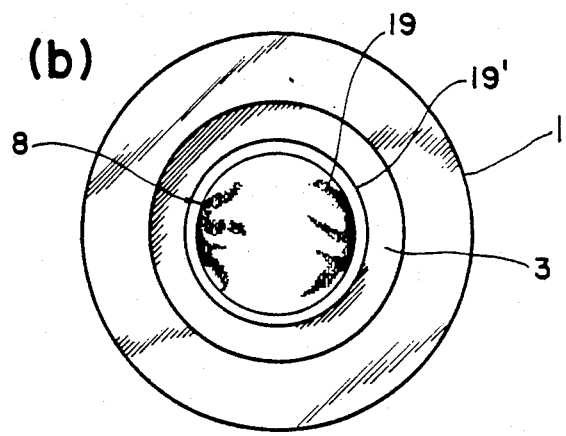

FIG. 4(a) shows a cross-sectional view and FIG. 4(b) a bottom view of a preferred embodiment of a vacuum chuck according to the present invention. This type of the chuck is convenient to handle a wafer in a horizontal position. The head 1 and holder 2 are made of polytetrafluoroethylene (PTFE), for example, or other similar materials, and are screwed together. However, they may be fabricated as one body by molding. In one embodiment the diameter of the head is about 30 mm, and its height is about 25 mm. The diameter of the cavity 3 is about 20 mm, and the height of the cavity is about 10 mm, for example. The length of the holder 2 is about 150 mm, and the diameter of the holder is about 15 mm, for example. One end of the holder 2 is shaped to form a nozzle 17 to be fixed to the hydraulic conduit 6 (not shown). The inner diameter of the manifold 4 is about 4 mm in the holder but as can be seen in FIG. 4(a), the diameter of the manifold 4 at the opening to the cavity 3 becomes larger (about 8 mm, for example) because the holder 2 is screwed into the head 1. This larger portion forms a second cavity 16. It is desirable to make the opening of the manifold larger compared to its remaining part as shown in FIG. 4(a) because this reduces the resistance of gas flow through the liquid-gas separating membrane 8 which is positioned at the opening of the expanded manifold (which in FIG. 4(a) includes manifold 4 and second cavity 16).

The liquid-gas separating membrane 8 is composed of two parts. The first part is a membrane layer 18 made of PTFE. It is processed to a porous membrane of about 0.07 mm thick having a plurality of pores. The pore size is about 0.1 μm. Gas molecules pass through these tiny holes, but liquid cannot pass therethrough. Thus, gas is separated from liquid. Such membrane is commercially available from Dupont in U.S.A. or Nitto Denko Co. of Tokyo, Japan. The membrane layer 18 is supported at both its upper and lower surfaces by a second part which includes upper and lower layers 19, each made of a woven mesh fiber of 0.2 mm in diameter and is made, for example, from tetrafluoroethylene-perfluoroalkyl-vinylether copolymer (PFA). The mesh layers 19 and the membrane layer 18 are stacked and heat bonded to an inner wall of the cavity 3 at their respective peripheral areas. Thus, the liquid-gas separating membrane 8 is bonded to the surface of the cavity 3 by instantaneously and partially melting the membrane and cavity at the portion to be bonded together with a heated iron. Bond areas 19' represent portions where material flow due to heating produces bonding. The liquid-gas separating membrane 8 is heat bonded on the surface of the cavity 1 in order to cover the opening of the manifold 4. In the embodiment of FIGS. 4(a) and 4(b), the liquid-gas separating membrane 8 is heat bonded around the opening of the second cavity 16. By such structure, the liquid-gas separating membrane 8 can bear the pressure of liquid even when one side of the membrane is being evacuated by the aspirator.

FIGS. 5(a) and 5(b) schematically illustrate the structure of a second embodiment of a vacuum chuck according to the present invention. This embodiment is used for holding a wafer vertically instead of horizontally. FIG. 5(a) is a front view, and FIG. 5(b) is a cross-sectional view taken along line B—B' in FIG. 5(a). The head 1 is held by a cylindrical holder 2. One end of manifold 4 of the holder 2 is linked to a core hole 21 of a pipe 20 which is connected to the switching valve (not shown) by hydraulic conduit 6. The head 1 is in the shape of a flat box having a cavity 3 formed therein. The cavity 3 is in communication with the manifold 4 via a second manifold 22 in the head 1. On one vertical sidewall of the cavity 3 is formed a rectangular inlet 5' of about 1×1.5 cm, for example. At the opening of the cavity to the rectangular inlet 5' is provided a liquid-gas separating membrane 8. The material used for these elements are the same as those used in the first embodiment described above.

Figure 3:
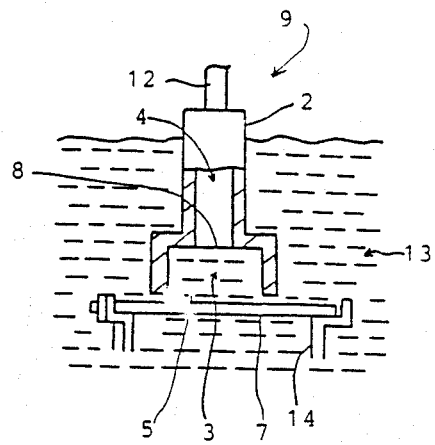
Figure 3:
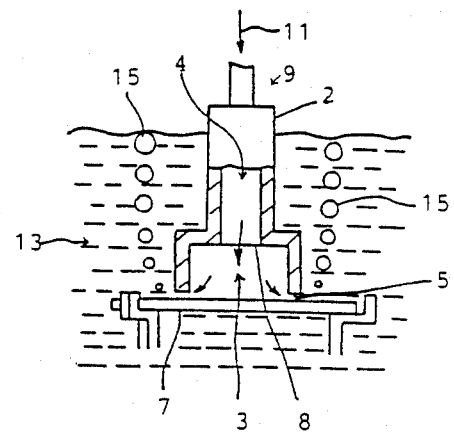
Figure 3:
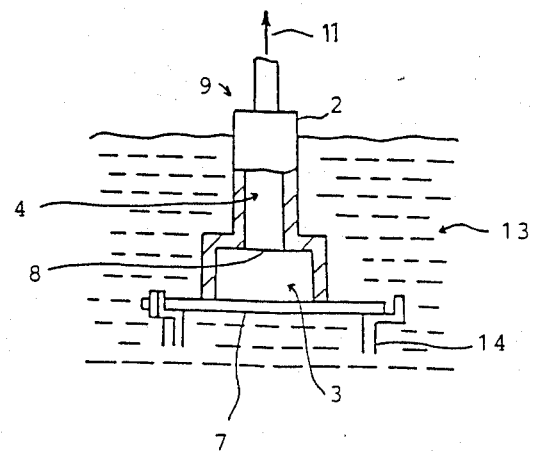

The operation of the second embodiment of the vacuum chuck shown in FIGS. 5(a) and 5(b) are similar to that of the first embodiment described with respect to FIGS. 2 and 3. The head 1 is immersed into the liquid (not shown) and juxtaposed to an upper edge portion of a wafer 7 facing the inlet 5'. In this case, eaves 23 of the head 1 are used to determine the relative position of the head 1 with respect to the wafer 7. The liquid outside of the inlet 5' is purged by compressed gas. At this stage, the liquid in the inlet 5' at its outside portion of the liquid-gas separating membrane 8 is almost purged, even though the membrane 8 is vertically disposed, because the pressure difference of the liquid over the liquid-gas separating membrane 8 is negligible, and the gas comes out through all areas of the liquid-gas separating membrane. Then, the switching valve is switched to the aspirator so that the wafer 8 is vacuumed to the head 1. If some quantity of liquid is left at the outside of the liquid-gas separating membrane 8, it does not effect operation because it is kept out by the liquid-gas separating membrane 8.

The holding force of the chuck depends on the size of the inlet and the vacuum in the chuck. An inlet size of 1.5 cm$^2$ (1 cm × 1.5 cm) and a vacuum of about 100 mm Hg obtained by ordinary aspirator provides the holding force of about 1.3 Kg weight. This is enough for holding the wafer tightly to the chuck and handling it in various ways.

Figure 5:
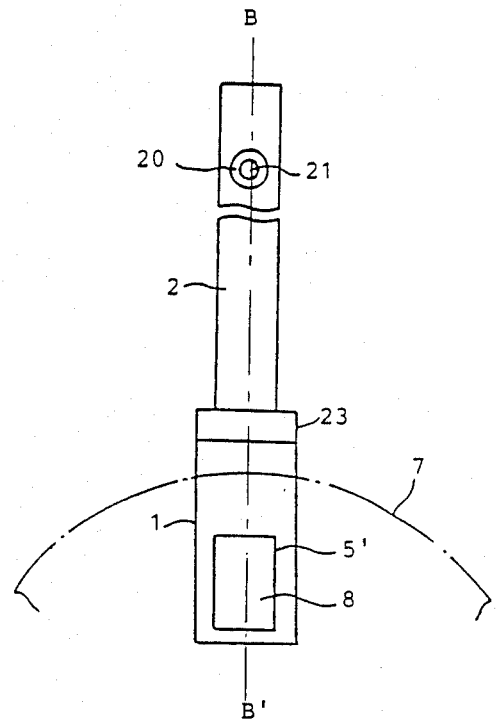
Figure 5:
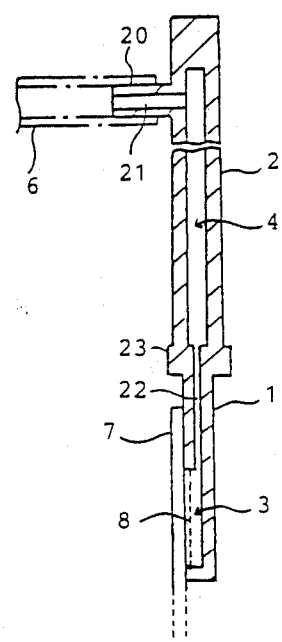
Figure 6:
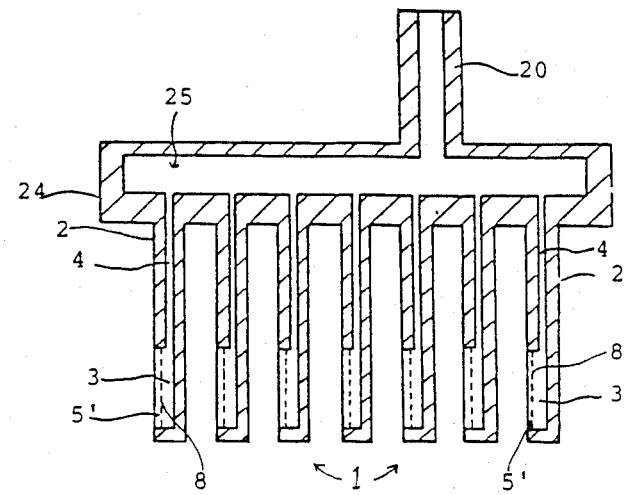
FIG. 6 is a schematic cross-sectional view of a third embodiment of a vacuum chuck according to the present invention, which handles a plurality of wafers at one time.

FIG. 6 shows schematically a cross-section of a third embodiment of the present invention, which is useful to handle a plurality of wafers at one time. In this embodiment, seven chuck heads 1, each being similar to the one shown in FIG. 5, are assembled to a common arm 24 by fixing each respective holder 2 thereto. The manifold 4 of each chuck is linked to a common manifold 25 formed in the common arm 24. The manifold 25 is connected to the switching valve (not shown) via a pipe 20 and hydraulic conduit (not shown). Materials for and sizes of the chucks are the same or similar to those of FIGS. 5(a) and 5(b). The common arm 24 is also made from PTFE.

Operation of the third embodiment is similar to that of the second embodiment. In this embodiment, seven wafers can be handled at one time. It should be noted that even if the number of wafers is less than the number of chucks, the system can operate because the liquid-gas separating membrane 8 of each unused chuck stops the flow of liquid into the cavity of the head 1. Further, even if one of the wafers is broken or dropped off from the chuck accidentally, that event will not adversely effect the operation of other chucks. This is because the volume of the inlet 5' outside of the liquid-gas separating membrane 8 is small compared to the total volume of the cavities 3, the manifolds 4 and the common manifold 25. Thus, the pressure increase caused by breaking or dropping a wafer is negligible in the remaining cavity which are holding wafers. Further, the aspirator is evacuating the common manifold 25 constantly, so the effect is further reduced. The shape of the head or the inlet may be varied in various ways according to the application, and the number of chucks may also be varied.

Next, various applications of the vacuum chucking system of the present invention will be described. First how the chucks are washed or cleaned will be described. It is important to wash or rinse the chuck to keep it clean. It is relatively easy to wash or rinse the chuck of the present invention in detergent or water. The chuck is immersed into the detergent or water as shown in FIGS. 3(a) or 3(b). During washing, the wafer 7 and its supporter 14 are removed. First, the switching valve is switched from compressor to aspirator repeatedly. At each time of switching, the detergent or water is filled or purged into or from the cavity 3, thus easily cleaning the chuck.

Figure 7:
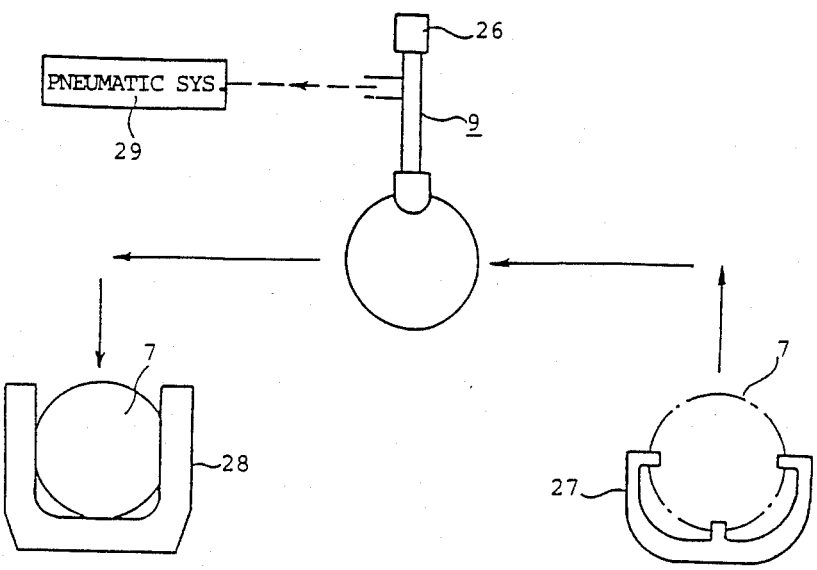
FIG. 7 illustrates an application of a vacuum chuck according to the present invention, showing how wafers are reloaded from one wafer holder to another.

FIG. 7 illustrates how a chuck of the second embodiment is used for reloading wafers from one wafer holder to another. Consider the case of reloading wafers 7 mounted on a wafer holder 27 which is made of silicon for an etching process, to a carrier holder 28 which is made of plastic (for example), or vice versa. A vacuum chuck 9 of the second embodiment type is used. The chuck is fixed to an arm 26 which is movable to the left and right, and up and down. The chuck is connected to a pneumatic system 29, which comprises a switching valve, an aspirator and a compressor as shown in FIG. 2. Operation is similar to that using an ordinary vacuum chuck which is used in air. The wafer 7 is taken out from the wafer holder 27 by the chuck 9 and inserted into the carrier holder 28 one by one. By using the vacuum chuck of the present invention, it is possible to perform wafer handling both in air and liquid ambient. Further, if a vacuum chuck of the third embodiment is used, a plurality of wafers can be handled at one time.

Figure 8:
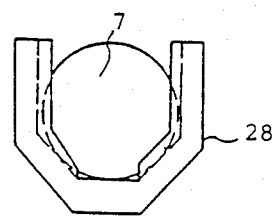
Figure 8:
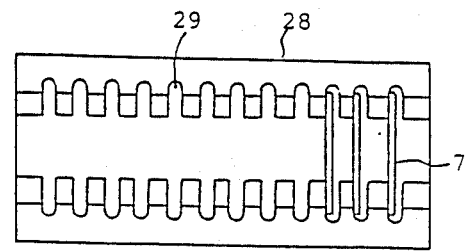

FIGS. 8(a) and 8(b) show an example of a wafer holder used in various processes. FIG. 8(a) is a side view, and FIG. 8(b) is a plan view of the holder. The wafers 7 are placed individually in a plurality of grooves 29. When a wet process is used employing such wafer holders, drops of liquid are left at the contact portions between the wafer and the holder, thus leaving stains on the wafer. Using the vacuum chuck of the present invention, it is easy to prevent such defects. The method will be described with respect to an etching process as an example.

Figure 9:
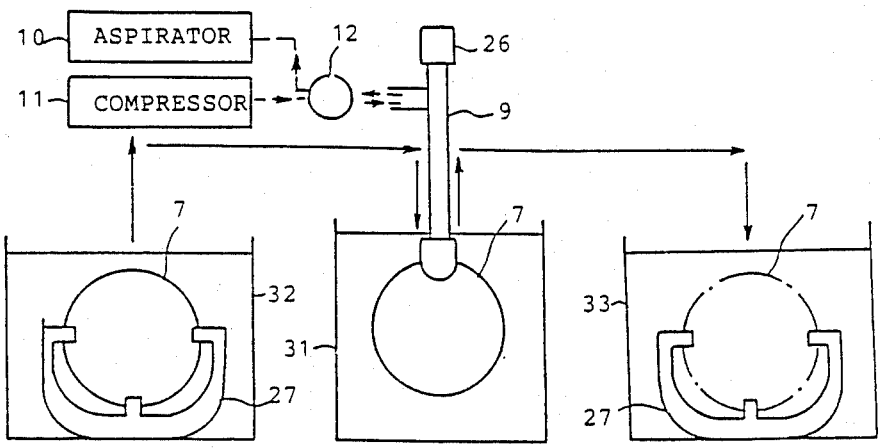
FIG. 9 schematically illustrates a second application of the vacuum chuck of the present invention which is applied to an etching process.

FIG. 9 illustrates a system for a wet process, such as an etching process. An etching tub 31 contains an etchant, a front tub 32 contains wafers 7 to be etched, and a rinsing tub 33 contains rinsing liquid which is usually water. The front tub may contain other processing liquids or it may be a simple air container. The wafers 7 are placed on a wafer holder 27. A vacuum chuck 9 of the second embodiment type which is fixed to an arm 26 is used. The arm 26 is movable to the left and right, and up and down, to keep the chuck 9 vertically oriented. The hold and release functions of the vacuum chuck 9 are controlled by an aspirator 10, a compressor 11 and a switching valve 12, in a manner described above.

The wafers 7 are taken out one by one by the vacuum chuck 9 from the front tub 32. At this time, the extracted wafer 7 is chucked from its back side so that the front side, which requires a substantially uniform etching, is not contacted by anything. The chuck 9 is moved along a path shown by directional arrows, and dips the wafer 9 into the etching tub 31 holding the wafer from its back side. When etching is finished, the chuck 9 brings the wafer into the rinsing tub 33, and then releases the wafer on the holder 27, where the etchant is quenched and the wafer is rinsed. In such a manner, the wafer is held from its backside, and the front side is free from irregular etching or stains caused by contact with the holder.

Figure 10:
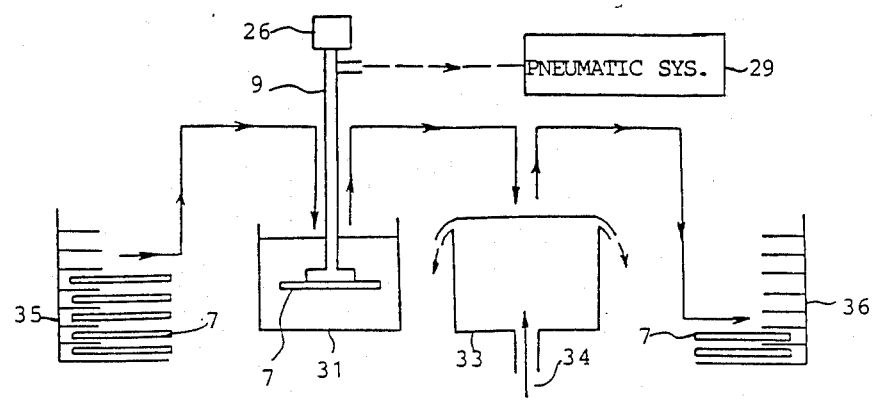
FIG. 10 schematically illustrates a third application of the vacuum chuck of the present invention which holds the wafer by its back surface, and performs an etching process in a one by one fashion.

FIG. 10 shows another application of the present invention, which will be described as an example for an etching process, although it could be applied to any other type of wet processing. The vacuum chuck 9 is the first embodiment described with respect to FIG. 3. The chuck is held by an arm 26 and controlled by a pneumatic system 29. The arm and pneumatic system are similar to those of FIGS. 7 and 9. A first wafer holder 35 for loading, and a second wafer holder 36 for unloading holds wafers 7 horizontally. Each of the wafers 7 is placed on the wafer holders keeping their front surface, which is to be etched, downward. The chuck 9 takes out the wafers 7 one by one, holding them from the back side, moves along a path shown by the directional arrows, and immerses the wafer into the etching tub 31. After etching is finished, the wafer is taken from the etching tub 31 and immersed in the rinsing tub 33. The rinsing tub 33 is fed rinsing water 34 from the bottom of the tub, which overflows from the top. Each wafer 7 is held in the water keeping the front side downward so that the front side is always met with fresh rinse water. This effectively rinses the front side quickly and provides a uniform etching over the entire front surface. When rinsing is finished, the wafer is released onto the receiving wafer holder 36. It will be apparent that in this system staining caused by the etchant due to contact with the holder is eliminated.

In the above description of an application of the vacuum chuck to various wet processes, the chuck may be moved by hand or moved automatically using robots or other automated mechanisms. The components of the system, such as the aspirator, compressor, wafer holders, etching tubs, etc., are conventional, and further description is not necessary.

The structure, operation and some fundamental applications of a vacuum chucking system according to the present invention have been described referring to preferred embodiments. It will be apparent that many modifications of above are possible. For example, materials may be varied from the ones specifically described. Also, the shape of the chuck and inlet holes may be varied. The object handled by the vacuum chuck also is not limited to a semiconductor wafer. For instance, it may be used to handle a cube or spherically-shaped object.

The many features and advantages of the present invention are apparent from the detailed specification, and thus, it is intended by the appended claims to cover all such features and advantages of the vacuum chuck apparatus which fall within the true spirit and scope of the invention. Further, since numerous modifications and changes will readily occur to those skilled in the art based upon the disclosure herein, it is not desired to limit the invention to the exact construction and operation illustrated and described. Accordingly, all suitable modifications and equivalents may be resorted to falling within the scope and the spirit of the invention.

What is claimed is:

1. A vacuum chuck apparatus operable in a liquid, said vacuum chuck apparatus being actuated by a pneumatic system which selectively evacuates and pressurizes said vacuum chuck apparatus for clamping and releasing an object, said vacuum chuck apparatus comprising:
   a head for holding the object and having two opposite ends, and a cavity formed at one end;
   an inlet formed in said head for vacuuming said object toward the head, said inlet being formed by said cavity;
   a holder for supporting said head;
   connection means, provided on said holder, for connecting said vacuum chuck apparatus to said pneumatic system;
   a manifold formed through said holder, for connecting said cavity to said connection means; and
   a liquid-gas separating membrane for separating gas from liquid, and being disposed within said cavity for preventing liquid from entering the manifold.

2. A vacuum chuck apparatus according to claim 1, wherein said liquid-gas separating membrane is disposed between said cavity and said inlet.

3. A vacuum chuck apparatus according to claim 1, wherein said liquid-gas separating membrane comprises a membrane having a plurality of tiny holes which allow passage therethrough of gas molecules but not liquid.

4. A vacuum chuck apparatus according to claim 1, wherein said head has a bottom, and said inlet is formed on the bottom of said head.

5. A vacuum chuck apparatus according to claim 1, wherein said head has a side wall, and said inlet is formed on the side wall of said head.

6. A vacuum chuck apparatus operable in a liquid, said vacuum chuck apparatus having a plurality of vacuum chucks arranged in parallel to each other and operated by a pneumatic system which selectively evacuates and pressurizes said vacuum chuck apparatus for clamping and releasing an object, each of said vacuum chucks comprising:
   a head for holding the object and having two opposite ends, a cavity formed at one end, and a side wall;
   an inlet formed on the side wall of said head, for vacuuming said object toward the head, said inlet being formed by said cavity;
   a holder for supporting said head;
   connection means, provided on said holder, for connecting said vacuum chuck apparatus to said pneumatic system;
   a manifold formed through said holder, for connecting said cavity to said connection means; and
   a liquid-gas separating membrane for separating gas from liquid and being disposed within said cavity for preventing liquid from entering the manifold.

7. A vacuum chuck apparatus according to claim 6, wherein said liquid-gas separating membrane is disposed between said cavity and said inlet.

8. A vacuum chuck apparatus according to claim 7, wherein said liquid-gas separating membrane includes a membrane having a plurality of tiny holes which allow passage therethrough of gas molecules but not liquid.

9. A vacuum chuck system having a vacuum chuck which is operable in a liquid, said system comprising:
   a pneumatic system for selectively evacuating and pressurizing said vacuum chuck thereby clamping and releasing an object to and from said vacuum chuck; and
   said vacuum chuck comprising:
   a head for holding the object and having two opposite ends, and a cavity formed at one end;
   an inlet formed on said head for vacuuming said object toward the head, said inlet being formed by said cavity;
   a holder for supporting said head;
   connection means, provided on said holder, for connecting said vacuum chuck apparatus to said pneumatic system;
   a manifold formed through said holder, for connecting said cavity to said connection means; and
   a liquid-gas separating membrane for separating gas from liquid, and being disposed within said cavity for preventing liquid from entering the manifold.

10. A vacuum chuck system according to claim 9, wherein said liquid-gas separating membrane is disposed between said cavity and said inlet.

11. A vacuum chuck system according to claim 9, wherein said pneumatic system comprises, an aspirator for evacuating said vacuum chuck, a compressed gas source for sending compressed gas to said vacuum chuck, and a switching valve, connected between said vacuum chuck and said aspirator and said compressed gas source, for selectively switching connection of said connection means of said vacuum chuck between said aspirator and said compressed gas means.

12. A vacuum chuck system according to claim 9, wherein said liquid-gas separating membrane includes a membrane having a plurality of tiny holes which allow passage therethrough of gas molecules but not liquid.

13. A method of handling objects with a vacuum chuck having an inlet formed by a cavity and a liquid-gas separating membrane disposed within the cavity wherein the membrane prevents passage of liquid, the method comprising:
   immersing the vacuum chuck into a liquid in proximity to an object to be handled;
   purging the liquid from the inlet with compressed gas supplied to the vacuum chuck from a compressed gas source, and after purging;
   aspirating the vacuum chuck with an aspirator thereby vacuuming the object against the inlet.

* * * * *